United States Patent
Choi et al.

(10) Patent No.: US 9,191,566 B2
(45) Date of Patent: Nov. 17, 2015

(54) IMAGE PICKUP APPARATUS, METHOD FOR IMAGE PICKUP AND COMPUTER-READABLE RECORDING MEDIUM

(71) Applicant: SAMSUNG ELECTRONICS CO., LTD., Suwon-si (KR)

(72) Inventors: Dong-bum Choi, Suwon-si (KR); Yong-ju Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 67 days.

(21) Appl. No.: 13/853,538

(22) Filed: Mar. 29, 2013

(65) Prior Publication Data

US 2013/0258149 A1    Oct. 3, 2013

Related U.S. Application Data

(60) Provisional application No. 61/617,943, filed on Mar. 30, 2012, provisional application No. 61/617,932, filed on Mar. 30, 2012.

(30) Foreign Application Priority Data

Oct. 12, 2012    (KR) .................. 10-2012-0113798

(51) Int. Cl.
*H04N 5/232* (2006.01)
*H04N 5/369* (2011.01)
*H04N 5/345* (2011.01)
*H01L 27/146* (2006.01)

(52) U.S. Cl.
CPC ........... *H04N 5/23212* (2013.01); *H04N 5/345* (2013.01); *H04N 5/3696* (2013.01); *H01L 27/14623* (2013.01)

(58) Field of Classification Search
None
See application file for complete search history.

(56) References Cited

U.S. PATENT DOCUMENTS

| | | | |
|---|---|---|---|
| 6,829,008 B1 | 12/2004 | Kondo et al. | |
| 6,906,751 B1 * | 6/2005 | Norita et al. | 348/349 |
| 7,839,444 B2 | 11/2010 | Kuruma | |
| 8,031,259 B2 | 10/2011 | Suzuki | |
| 8,102,463 B2 * | 1/2012 | Komaba et al. | 348/349 |
| 8,222,709 B2 | 7/2012 | Oike et al. | |
| 8,405,761 B2 * | 3/2013 | Watanabe et al. | 348/349 |
| 2005/0185086 A1 * | 8/2005 | Onozawa | 348/349 |
| 2007/0070235 A1 * | 3/2007 | Maejima et al. | 348/335 |
| 2007/0096238 A1 | 5/2007 | Oike et al. | |
| 2007/0126909 A1 * | 6/2007 | Kuruma | 348/333.01 |

(Continued)

FOREIGN PATENT DOCUMENTS

| | | | |
|---|---|---|---|
| JP | 2000-156823 A | 6/2000 | |
| JP | 2000-354185 A | 12/2000 | |

(Continued)

*Primary Examiner* — Michael Osinski
(74) *Attorney, Agent, or Firm* — Sughrue Mion, PLLC

(57) ABSTRACT

An image pickup apparatus, an image pickup method and a non-transitory computer readable recording medium are provided. The image pickup apparatus includes an image sensor including a first pixel group and a second pixel group, a controller which controls the image sensor to capture an image of an object by using the first pixel group and to capture a live view of the object by using the second pixel group, a storage which stores the image captured by the first pixel group, and an auto focusing (AF) processor which generates AF information by using the live view captured by the second pixel group.

15 Claims, 14 Drawing Sheets

(56) References Cited

U.S. PATENT DOCUMENTS

| | | | |
|---|---|---|---|
| 2007/0206940 A1* | 9/2007 | Kusaka | 396/128 |
| 2008/0118238 A1* | 5/2008 | Sogawa et al. | 396/128 |
| 2009/0096886 A1* | 4/2009 | Kusaka | 348/222.1 |
| 2009/0129767 A1* | 5/2009 | Son et al. | 396/127 |
| 2009/0140122 A1* | 6/2009 | Suzuki | 250/201.2 |
| 2009/0147123 A1* | 6/2009 | Fujii | 348/333.12 |
| 2010/0045849 A1* | 2/2010 | Yamasaki | 348/349 |
| 2010/0091161 A1* | 4/2010 | Suzuki | 348/302 |
| 2010/0141801 A1* | 6/2010 | Okamoto et al. | 348/240.3 |
| 2011/0109776 A1* | 5/2011 | Kawai | 348/273 |
| 2011/0228053 A1* | 9/2011 | Aoki | 348/49 |
| 2011/0267511 A1* | 11/2011 | Imafuji | 348/294 |
| 2012/0133813 A1* | 5/2012 | Nagano | 348/311 |
| 2012/0147238 A1* | 6/2012 | Kita et al. | 348/302 |
| 2012/0188425 A1* | 7/2012 | Kita | 348/294 |
| 2012/0212662 A1* | 8/2012 | Shimoda et al. | 348/349 |
| 2012/0224096 A1* | 9/2012 | Shimoda et al. | 348/349 |
| 2012/0249846 A1* | 10/2012 | Nishio et al. | 348/294 |
| 2013/0107067 A1* | 5/2013 | Miyakoshi | 348/208.5 |
| 2013/0120609 A1* | 5/2013 | Okazawa | 348/223.1 |
| 2013/0120644 A1* | 5/2013 | Fujii | 348/349 |
| 2013/0128097 A1* | 5/2013 | Nishio | 348/345 |
| 2014/0232913 A1* | 8/2014 | Sakane | 348/294 |

FOREIGN PATENT DOCUMENTS

| | | |
|---|---|---|
| JP | 2001-296470 A | 10/2001 |
| JP | 2004-120724 A | 4/2004 |
| JP | 2009-86037 A | 4/2009 |
| JP | 2009-88679 A | 4/2009 |
| JP | 2009-130580 A | 6/2009 |
| JP | 2011-60815 A | 3/2011 |
| JP | 2012-49994 A | 3/2012 |
| KR | 10-2007-0045994 A | 5/2007 |
| KR | 10-2007-0055950 A | 5/2007 |

* cited by examiner

IMAGE PICKUP APPARATUS, METHOD FOR IMAGE PICKUP AND COMPUTER-READABLE RECORDING MEDIUM

CROSS-REFERENCE TO RELATED APPLICATIONS

This application claims priority from U.S. Provisional Patent Application No. 61/617,932, filed on Mar. 30, 2012, in the United States Patents and Trademark Office, U.S. Provisional Patent Application No. 61/617,943, filed on Mar. 30, 2012, in the United States Patent and Trademark Office, and Korean Patent Application No. 10-2012-0113798, filed on Oct. 12, 2012, in the Korean Intellectual Property Office, the disclosures of which are incorporated herein by reference in their entirety.

BACKGROUND

1. Field

Apparatuses, methods, and media consistent with the present disclosure relate to an image pickup apparatus, a method for image pickup, and a computer-readable recording medium, and more specifically, to an image pickup apparatus which acquires auto focusing information promptly and precisely, a method for image pickup, and a computer-readable medium.

2. Description of the Related Art

Recently, digital cameras are being developed which enhance the quality of the velocity and the preciseness of auto focusing (AF) and which include a smaller and lighter main case to meet the consumer's demands.

However, because the image sensor of the conventional camera cannot acquire the precise AF information of an object during consecutive image pickup (capture) operations, the image pickup apparatus needs to stop at every image pickup operation to collect the precise AF information. Further, because the conventional camera cannot acquire and display the current information of the object in single or consecutive image pickup operations, the displaying operation is stopped to acquire the information.

In addition, to acquire the AF information of the object, a conventional method of acquiring phase differential AF information detects the phase differential information using a shielding device to shield a part of pixels of an image sensor. However, this method has a shortcoming in that the pixel information of the original image is lost.

Thus, a new image sensor is necessary, which can acquire the AF information without compromising pixels of an original image, while displaying the live view image in consecutive image pickup operations.

SUMMARY

Exemplary embodiments of the present disclosure overcome the above disadvantages and other disadvantages not described above. Also, the exemplary embodiments are not required to overcome the disadvantages described above, and an exemplary embodiment of the present disclosure may not overcome any of the problems described above.

According to an exemplary embodiment, a technical objective is to provide an image pickup apparatus which acquires auto focusing (AF) information precisely and promptly, an image pickup method and a computer-readable recording medium.

According to an exemplary embodiment, an image pickup apparatus is provided, which may include an image sensor including a first pixel group and a second pixel group, a controller which controls the image sensor to capture an image of an object by using the first pixel group and to capture a live view of the object by using the second pixel group, a storage which stores the image captured by the first pixel group, and an auto focusing (AF) processor which generates AF information by utilizing the live view captured by the second pixel group.

The AF processor may generate the AF information by performing contrast auto-focusing of the live view captured by the second pixel group.

The second pixel group may additionally include a plurality of pixels and a shielding component to generate a phase difference of incident light received at each of the pixels, and the AF processor generates the AF information by performing phase differential AF of the live view captured by the second pixel group based on the phase difference.

The image pickup apparatus may additionally include a user interface which receives a consecutive image capture command and transmits the consecutive image capture command to the controller. The controller, upon receiving the consecutive image capture command, may control the image sensor to perform consecutive image captures by using the first pixel group at a predetermined time interval, and to continuously capture the live view by using the second pixel group during the consecutive image captures.

The controller may control the image sensor to adjust a focus of the image sensor based on a live view captured at a time of beginning each image capture by using the AF information generated by the AF processor.

The first pixel group may include a plurality of first pixels arranged in a matrix form having a plurality of lines and a plurality of columns, and the second pixel group may include a plurality of second pixels arranged to be matched with the first pixels, respectively.

Some of the plurality of second pixels may include a shielding component to partly shield incident light.

A size of each of the first pixels may be greater than a size of each of the second pixels, and a number of the first pixels may be greater than a number of the second pixels.

The image pickup apparatus may additionally include a display which continuously displays the live view.

According to another exemplary embodiment, an image pickup method which is performed by an image pickup apparatus having an image sensor may include capturing image data of an object by using a first pixel group of the image sensor, and capturing a live view of the object by using a second pixel group of the image sensor, storing the image data captured by the first pixel group, and displaying the live view captured by the second pixel group.

The image pickup method may additionally include generating auto-focusing (AF) information by performing contrast AF on the live view.

The image pickup method may additionally include generating auto-focusing (AF) information by performing phase differential AF on the live view.

During consecutive image captures, the image pickup method may additionally include generating the AF information by performing the contrast AF of a live view captured at a time of beginning each image capture, and adjusting a focus by using the AF information generated at the time of beginning each image capture.

During consecutive image captures, the image pickup method may additionally include generating the AF information by performing the phase differential AF of a live view captured at a time of beginning each image capture, and adjusting a focus by using the AF information generated at the time of beginning each image capture.

The first pixel group may include a plurality of first pixels arranged in matrix form having a plurality of lines and a plurality of columns, and the second pixel group may include a plurality of second pixels arranged to be matched with the first pixels, respectively.

A size of each of the first pixels may be greater than a size of each of the second pixels, and a number of the first pixels may be greater than a number of the second pixels.

According to another exemplary embodiment, a non-transitory computer-readable recording medium having a program stored thereon causes a computer to implement an image pickup method including capturing image data of an object by using a first pixel group of an image sensor, and capturing a live view of the object by using a second pixel group of the image sensor, storing the image data captured by the first pixel group, and displaying the live view captured by the second pixel group.

According to another exemplary embodiment, an image pickup apparatus includes an image sensor including a first pixel group having a first pixel value and capturing a first image, and a second pixel group having a second pixel value which is lower than the first pixel value and capturing a second image, and a controller which generates focus information for the first image based on the captured second image, wherein the first and second pixel values indicate pixel resolution values.

BRIEF DESCRIPTION OF THE DRAWINGS

The above and/or other aspects of the present disclosure will be more apparent by describing certain exemplary embodiments of the present disclosure with reference to the accompanying drawings, in which.

DETAILED DESCRIPTION OF EXEMPLARY EMBODIMENTS

Figure 1:
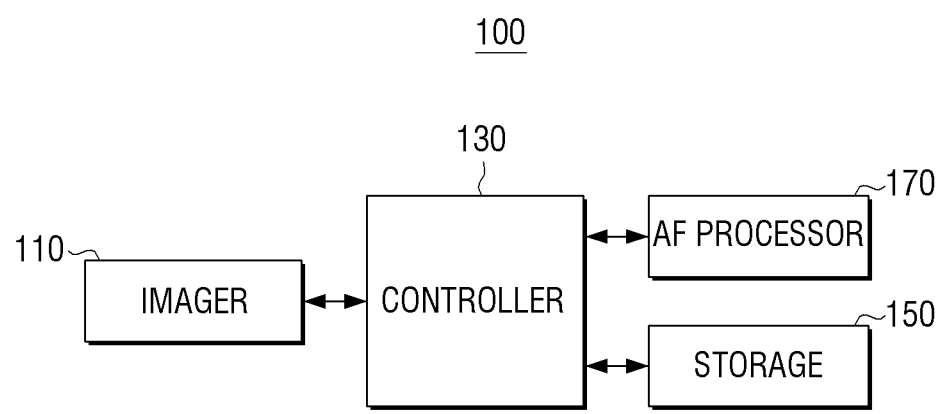
FIG. 1 is a block diagram of an image pickup apparatus according to an exemplary embodiment.

Certain exemplary embodiments of the present disclosure will now be described in greater detail with reference to the accompanying drawings.

In the following description, the same drawing reference numerals are used for the same elements even in different drawings. The matters defined in the description, such as detailed construction and elements, are provided to assist in a comprehensive understanding of the present disclosure. Accordingly, it is apparent that the exemplary embodiments of the present disclosure can be carried out without those specifically defined matters. Also, well-known functions or constructions are not described in detail since they would obscure the present disclosure with unnecessary detail.

FIG. 1 is a block diagram of an image pickup apparatus according to an exemplary embodiment.

Referring to FIG. 1, an image pickup apparatus 100 includes an imager 110, e.g., image sensor, a controller 130, a storage 150, and an auto focusing (AF) processor 170.

The imager 110 may be classified into a first pixel group and a second pixel group.

The controller 130 may control the imager 110 to image an object by utilizing (using) the first pixel group, and to acquire the live view of the object by utilizing the second pixel group. According to an exemplary embodiment, the term "live view" may refer to a function of the image pickup apparatus 100 which enables a user to see in real time the same image seen through a lens of the image pickup apparatus 100.

The storage 150 may store the image data obtained by the first pixel group.

The AF processor 170 may generate AF information from the pixel value of the live view acquired by the second pixel group.

Specifically, the second pixel group may further include a shielding component in the respective pixels. The AF processor 170 may perform a phase differential AF operation on the live view acquired by the second pixel group to generate the AF information.

The AF processor 170 may perform a contrast AF operation of the live view acquired by the second pixel group to generate the AF information.

Figure 2:
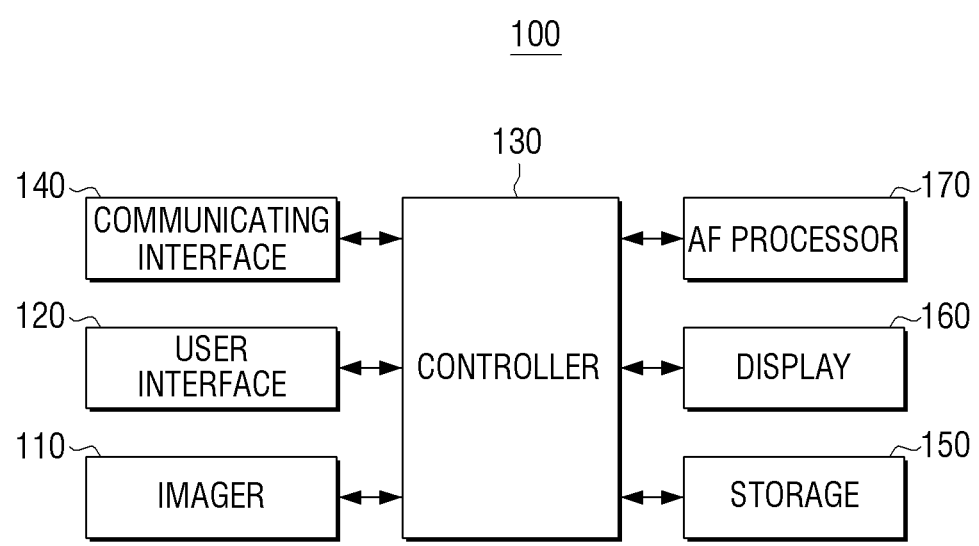
FIG. 2 is a detailed block diagram of an image pickup apparatus according to an exemplary embodiment.

FIG. 2 is a block diagram of an image pickup apparatus according to an exemplary embodiment.

Referring to FIG. 2, the image pickup apparatus 100 according to an exemplary embodiment includes an imager 110, a user interface 120, a controller 130, a communicating interface 140, a storage 150, a display 160 and an AF processor 170.

The image pickup apparatus 100 according to an exemplary embodiment may be implemented in many different types of devices, such as, for example, a digital camera, a camcorder, a mobile phone, a smart phone, a tablet PC, a PMP, a webcam, a black box, or other types of devices.

The communicating interface 140 may be configured to connect to at least one terminal apparatus (not illustrated). The communicating interface 140 may connect to the terminal apparatus in many different ways, such as, for example, in a wired or wireless manner via Local Area Network (LAN) and the Internet, or a Universal Serial Bus (USB) port or a Bluetooth module.

The communicating interface 140 may transmit the contents stored at the image pickup apparatus 100 to an external terminal apparatus (not illustrated). Specifically, the communicating interface 140 may transmit the image file stored in the storage 150, which will be described below, to the external terminal apparatus (not illustrated) or the server. The contents may be the image contents or the video contents that the image pickup apparatus generates.

The user interface 120 may include a plurality of function keys with which a user may set or select various functions supported by the image pickup apparatus 100, and may display various types of information provided by the image pickup apparatus 100. The user interface 120 may be implemented in a form such as a touchpad that is configured to process both input and output at the same time, and may include an input component such as a plurality of buttons and an indicating component such as an LCD or an OLED.

The user interface 120 may receive various types of control commands, such as an image pickup (capture) command (e.g., a consecutive image capture command) or a shutter command. The user interface 120 may receive a setting command which sets at least one function of the image pickup. Specifically, the user interface 120 may receive the setting to determine the file format of the photographed image, the resolution, the digital zooming, the Auto White Balance (AWB), the Auto Focus (AF), or the Auto Exposure (AE) of the photographed image.

The user interface 120 may display the photographed image. Specifically, the user interface 120 may display the photographed image in accordance with the user's image pickup command.

According to a playback command issued by a user, the user interface 120 may display various types of the contents stored in the storage 150. The contents may be the image contents or the video contents. For instance, if the image pickup apparatus 100 is configured to record a video, the user interface 120 may playback video contents previously stored in the storage 150.

The storage 150 may store the pixel values read out by the imager 110 in series per pixel groups. Specifically, the storage 150 may store the data (e.g., the pixel values of the first pixel group and the second pixel group) in sequence, which is transmitted from the imager 110 to be described below. The transmitted data may be in compressed data form, although is not limited thereto.

The storage 150 may store the generated image. Specifically, the storage 150 may store the image generated and compensated by the image processor to be described below.

The storage 150 may be implemented as an internal recording medium within the image pickup apparatus 100 and/or an external recording medium such as, for instance, a removable disk including a USB memory or a flash memory, a recording medium connected to the image pickup apparatus, or a web server connected through a network, and may include a transitory memory such as a double data rate (DDR) memory for high-speed storage. Specifically, the pixel value transmitted to the imager 110 may be temporarily stored in the transitory memory for high-speed processing.

The imager 110 may include an image pickup device which is physically classified into a first pixel group and a second pixel group, and may acquire an image of an object by utilizing a plurality of first and second pixel groups arranged in a matrix form. Specifically, the imager 110 may include a lens which collects the lights from the object and converges an optical image on the image pickup area, the image pickup device which photo-electrically converts the light introduced via the lens into electrical signals, and an analog-to-digital (AD) converter which converts analog singles of the image pickup device into digital signals and outputs the converted digital signals. The image pickup device may be a charge coupled device (CCD) or a complementary metal oxide semiconductor (CMOS), although is not limited thereto. The constitution and operations of the imager 110 will be further described below by referring to FIG. 3.

The image processor (not illustrated) may generate the image. Specifically, the image processor may combine the pixel values of each pixel group stored on the storage 150 and generate an image. If the pixel values stored on the storage 150 are stored as compressed data, the image processor may restore the compressed data to the pixel values and generate an image by utilizing the restored pixel values.

The image processor may perform various types of signal processing operations, such as format converting, digital zooming to adjust the image scale, AWB, AF, or AE of the generated image. Further, according to exemplary embodiments, the image processor may generate a video file by combining the voice signals received by an internal or an external microphone with a plurality of photographed images, and store the generated video file on the storage 150.

The display 160 may display the image acquired by the imager 110. The display 160 may be implemented to be integrated with the user interface 120. Further, the display 160 may be implemented as a separate touch panel operating the same technology as the user interface 120.

According to an exemplary embodiment, the display 160 may display the live view image of the image received from the second pixel group of the imager 110. The display 160 may display the live view image or images of the image of the subject of photography consecutively. The live view image displayed on the display 160 may be acquired as a still image or video image by the user's image pickup command and stored in the storage 150.

The AF processor 170 may perform the AF processing of the image by utilizing the pixel values generated by the imager 110. For instance, the AF processor 170 may implement a phase differential AF method, which adjusts a focal point by utilizing the fact that, when incident light passed through the lens 114 is divided into two on the back of a focal plane and converged on different line sensors from each other, the distance (i.e., phase) between the two object phases changes according to the position of the focal point. Based on the position meeting the focal point, the front focusing may have a narrower distance between the two objects, and the back focusing may have a broader distance between the two objects. In consideration of these features, the focal point may be met. The phase differential AF method may accelerate the AF speed because the direction of the focusing is determined within a time period of a flash according to the distance of the object phase.

According to the phase differential AF method, the AF processor 170 may adjust the focal point by utilizing the phase differential information included in the pixel values read out by the second pixel group of the imager 110. Specifically, the phase differential AF processor 170 may analyze the live view image read out by the second pixel group. The phase differential AF processor 170 may analyze the phase differential information included in the live view image in each frame of the displayed live view image, detect the phase differential AF information, and transmit the information to the controller 130.

According to the contrast AF method, the AF processor 170 may perform the AF of the object focal point by utilizing the pixel values generated by the imager 110. The AF processor 170 may implement the contrast AF method. The contrast AF method may move the lens to the most proper position for the lens to achieve an optimized focus based on the features of the contrast values. While moving the lens, the contrast value of the pixel values read out by the second pixel group of the imager 110 may be converted to electrical signals. By analyzing the wave form of the converted electrical signals, the lens may be moved to a lens position which is optimized for the focus to adjust the focal point of the object.

The AF processor 170 may detect the contrast values from the pixel values constituting the live view image acquired by the imager 110, compare the contrast values, and determine the point optimized for the focus as the focal point of the object. The AF processor 170 may transmit the focal point information to the controller 130.

The controller 130 may control the respective components within the image pickup apparatus 100. Specifically, if the image pickup command is inputted by a user, the controller 130 may scan a first reset signal and a second reset signal which begin the exposure of the pixel on the first pixel group and the second pixel group sequentially. If the reading command is inputted by the user, the controller 130 may detect the phase differential AF information included in the live view image information at the time of inputting, adjust the focal point of the object at the time of inputting, and control the reading the first pixel group.

The controller 130 may control the storage 150 to only store the data transmitted from the imager 110 during image pickup.

During the image pickup performed by the imager 110, the controller 130 may control the live view image to be displayed through the user interface 120 or the display 160. Simultaneously, the controller 130 may control the image processor to compress and store the photographed image on the storage 150 or generate the image by utilizing the stored pixel value of each pixel group.

Compared to the conventional image pickup apparatus, the image pickup apparatus 100 according to exemplary embodiments may continuously display the live view image on the display 160, perform the AF to detect the phase differential information from the live view image, and read the still image or the video image captured during the image pickup movement of the user. By simultaneously processing the displaying of the live view image, the AF, and the capturing of the still image or video image, it is unnecessary to stop capturing the still image to process the AF, and the phase differential AF may be processed in each frame based on the live view image. Thus, the exemplary embodiment has the effect of capturing the auto focused still image promptly.

Further, the image pickup apparatus 100 according to an exemplary embodiment may consecutively display the live view image, adjust the focal point of the photographed image by processing the phase differential AF, and store the photographed image.

Meanwhile, referring to FIG. 1, although not illustrated, the image processor may be constituted as a component other than a component within the controller 130, or may be implemented as being included in the controller 130 such as a System On a Chip (SOC). These exemplary aspects will be further described below by referring to FIG. 3.

Figure 3:
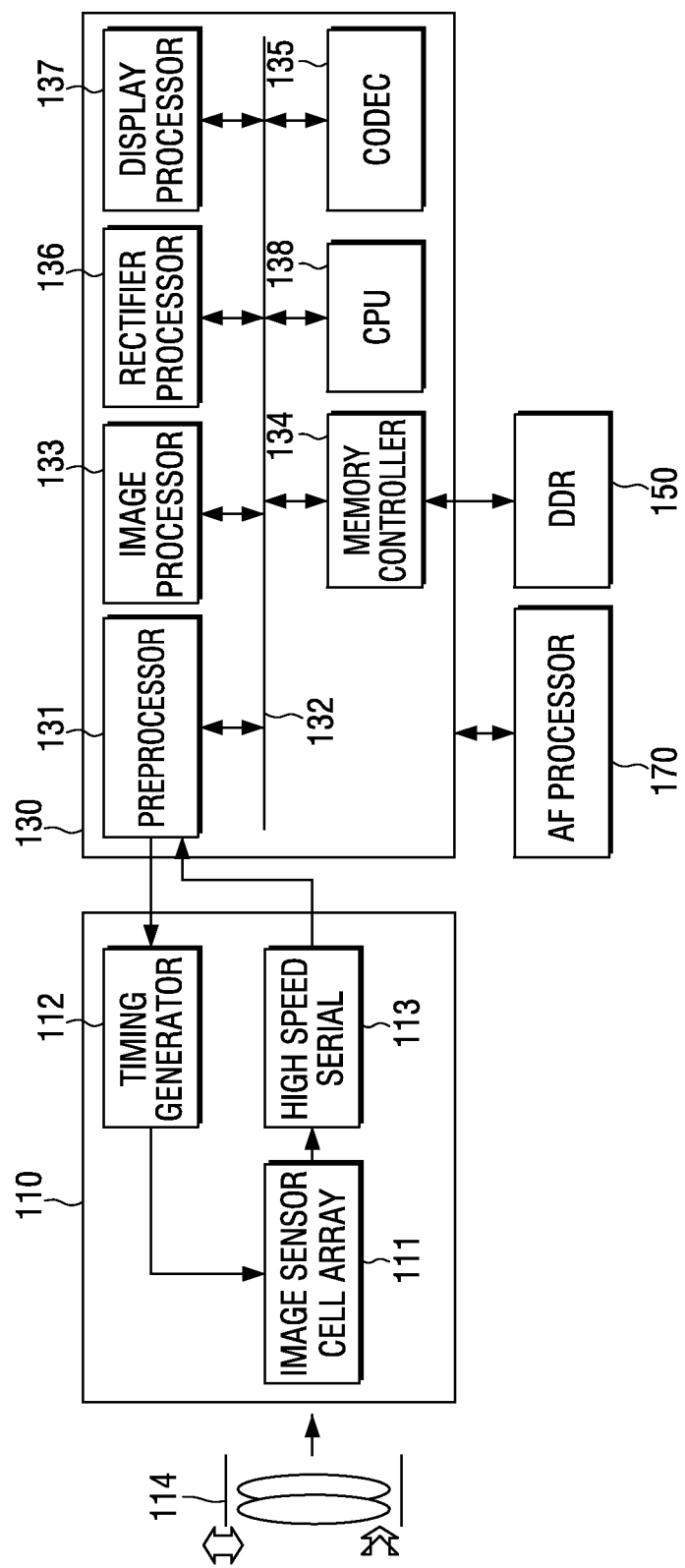
FIG. 3 is a detailed block diagram of an imager and a controller of FIG. 2 according to an exemplary embodiment.

FIG. 3 is a view provided to explain the detailed constitution of the imager and the controller of FIG. 2.

Referring to FIG. 3, the imager 110 may include an image pickup device 111 (e.g., an image sensor cell array), a timing generator 112, a high speed serial 113, and a lens 114. The controller 130 may include a preprocessor 131, a bus 132, an image processor 133, a memory controller 134, a codec 135, a rectifier processor 136, a display processor 137 and a CPU 138.

First, the imager 110 will be explained. The image pickup device 111 of the imager 110 may be classified into a plurality of first pixel groups and a plurality of second pixel groups. Each pixel group may be arranged in a matrix form. The image pickup device 111 may utilize a plurality of first and second pixel groups and photo-electrically convert the light passing through the lens 114 to electrical signals. The image pickup device 111 may convert the analog signals of the photo-electrically converted lights to the digital signals. The image pickup device 111 may be a CCD image pickup device and/or a CMOS image pickup device. The detailed constitution and functions of the image pickup device 111 will be described below by referring to FIG. 4.

The timing generator 112 may control the image pickup function of the image pickup device 111. Specifically, the timing generator 112 may generate the reset signals to begin the exposure of the pixel and the controlling signals to control reading the time of the photo-electrically converted electrical signals, and provide the reset signals and the controlling signals to the image pickup device 111. The time of the reset signals and the controlling singles generated in the timing generator 112 will be described below by referring to FIG. 4.

The high speed serial 113 may transmit 24-bit RGB (Red/Green/Blue) color data according to sub-low voltage differential signaling (sub LVDS). The high speed serial 113 may transmit the pixel values of the photographed image to the controller 130.

The image pickup device 111 according to an exemplary embodiment may be implemented as a 24 megapixel (Mpixel) image component, and perform the high speed image pickup operation from tens of the image to hundreds of the image by using the image pickup. To process the photographed image generated by the high speed image pickup, the high speed serial 113 may have a throughput of, for example, several Giga pixels per second. Further, because one pixel may have 12 bit, 14 bit, and 16 bit image data, for instance, the high speed serial 113 may have a throughput of tens of gigabytes (Gbyte) per second.

The lens 114 may collect the light of the object and converge the optical image on the image pickup area of the image pickup device 111.

The controller 130 may receive the pixel values on a pixel group basis or as compressed pixel values (also referred to as 'data' hereinbelow), and store the received data in a transitory memory (e.g., DDR) 150. It is understood that various types of memories other than the transitory memory 150 may also be used. The controller 130 may combine the previously stored data on a pixel group basis and generate an image. The controller 130 may perform a correction process, such as illumination correction, to correct the generated image.

The preprocessor 131 may convert the data received from the imager 110 to parallel data. Specifically, the preprocessor 131 may convert the serial data transmitted through the high speed serial 113 of the imager 110 to the parallel data, and transmit the converted parallel data to a memory controller 134 so as to store the converted parallel data on the transitory memory 150.

The bus 132 may transmit signals between the components within the controller 130.

The image processor 133 may process the pixel values stored in the memory 150 and generate an image.

The image processor 133 may perform signal processing operations, such as format converting, digital zooming to adjust the image scale, AWB, AF, and AE, of the image.

A restorer (not illustrated) may restore the compressed data temporarily stored in the transitory memory 145. Specifically, the restorer (not illustrated) may utilize restoring algorithms corresponding to compressing algorithms applied to the compressed data and restore the compressed data per the pixel group.

The memory controller 134 may control an operation of the transitory memory 150, which may be a DDR. Specifically, the memory controller 134 may control the reading or writing operation of the storage 150 according to the request of the other components within the controller 130. However, if photographing, in other words, if high speed and high capacity data are being stored from the imager 110, the memory controller 134 may control the storage 150 to utilize 100% of the resource for the writing operation.

If the image pickup apparatus 100 is performing an operation of capturing video, the codec 135 may encode a plurality of images to generate a plurality of images acquired by the imager 110 as a video file. Further, according to exemplary embodiments, the codec 135 may combine the voice signals recorded through an internal microphone or an external microphone and a plurality of photographed images and generate the video file.

The display processor 137 may generate the user interface window to be displayed on the user interface 120 or control the operation of the user interface 120. Further, the display processor 137 may control displaying the image on the user interface 120 or the display 160.

The CPU 178 may control the respective components within the controller 130. Specifically, the CPU 178 may control the timing generator to scan the reset signals to begin the exposure of pixels on the pixel group of the image pickup device 111 at different times, if the image pickup command is inputted from the user. Further, the CPU 178 may control the timing generator 112 to provide controlling signals to read the pixel values of the pixel group scanned by the reset signals to the image pickup device 111.

Figure 4:
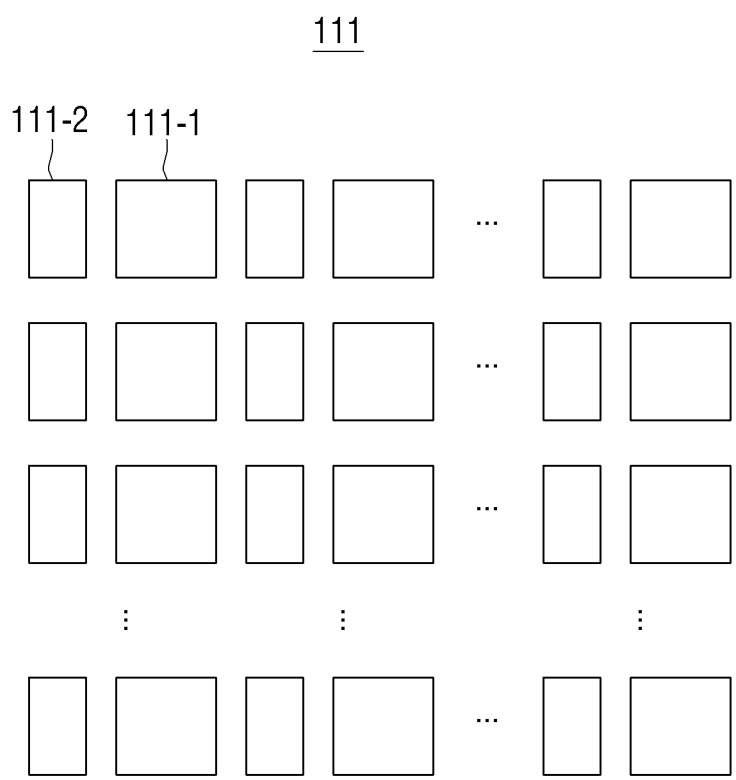
FIG. 4 is a diagram provided to further explain the imager according to an exemplary embodiment.

FIG. 4 is a view provided to explain the imager according to an exemplary embodiment.

Referring to FIG. 4, the image pickup device 111 according to an exemplary embodiment may be divided into a first pixel group 111-1 and a second pixel group 111-2. The first pixel group 111-1 may include a plurality of pixels, and each pixel of the first pixel group 111-1 may photograph the object. The second pixel group 111-2 may include a plurality of pixels, and each pixel of the second pixel group 111-2 may photograph the live view image of the object.

FIG. 4 is a view provided to explain the N×M matrix form of the pixel group. The first pixel group 111-1 and the second pixel group 111-2 may include the same number of the pixels, although are not limited thereto.

Referring to FIG. 4, the first pixel group 111-1 may be implemented to photograph the object, and thus, the number of the pixels in the first pixel group 111-1 may be the same as or more than the number of the pixels in the second pixel group 111-2. The second pixel group 111-2 may be placed between the pixels of the first pixel group 111-2, or may be placed randomly. The number of the pixels in the second pixel group 111-2 may be the same as or less than the number of the pixels in the first pixel group 111-1.

The pixel size of the first pixel group 111-1 and the second pixel group 111-2 according to an exemplary embodiment may be the same. Otherwise, the pixel size of the first pixel group 111-1 may be greater than the pixel size of the second pixel group 111-2.

Figure 5:
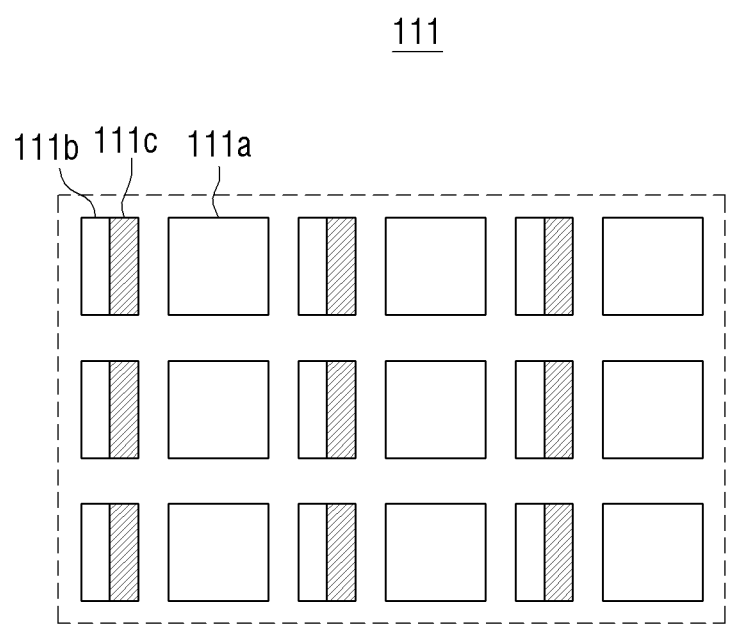
FIG. 5 is a view provided to explain a shielding component included in the pixels constituting the imager according to an exemplary embodiment.
Figure 6:
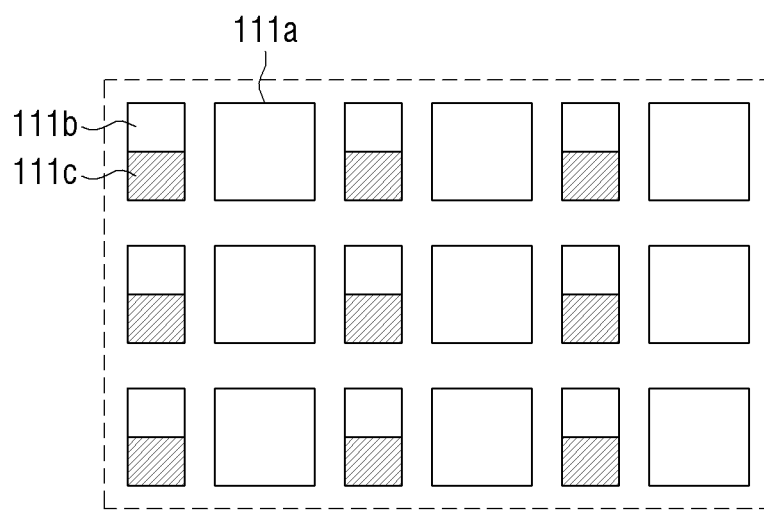
FIG. 6 is a view provided to explain the shielding component included in the pixels constituting the imager according to another exemplary embodiment.
Figure 7:
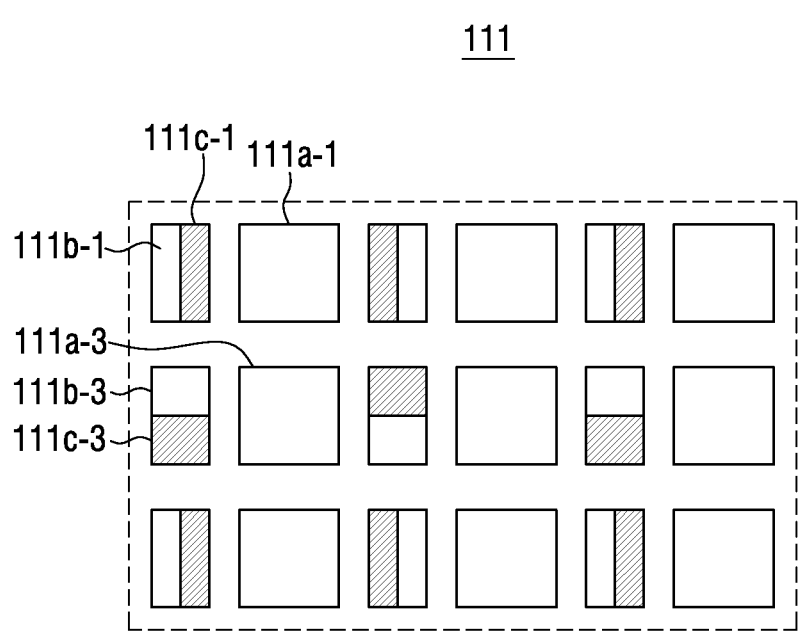
FIG. 7 is a view provided to explain the shielding component included in the pixels constituting the imager according to another exemplary embodiment.

FIGS. 5 to 7 are diagrams describing the various exemplary embodiments of the shielding component included in the pixels constituting the imager 110.

With reference to FIGS. 5 to 7, the image pickup device 111 may include a matrix form of the first pixel group 111-1 and the second pixel group 111-2. More specifically, one cell may include a first pixel 111a and a second pixel 111b. The first pixel 111a may read the still or the video image and the second pixel 111b may read the live view image. The second pixel 111b may include a shielding component 111c to partly shield the incident lights. By employing the shielding component 111c, the incident light going to the second pixel 111b may have a phase difference.

FIG. 5 is a view provided to explain an exemplary embodiment in which the shielding component 111c for shielding the incident light which passes through the second pixel 111b is formed on the right side of the second pixel 111b when the second pixel 111b is divided horizontal-symmetrically. By referring to FIG. 5, other second pixels 111b may also have the shielding components on the respective right sides thereof. However, this is merely an exemplary embodiment; the second pixel may not be divided horizontal-symmetrically and the shielding component 111c may be formed in other places, for example, on the left side.

FIG. 6 is a view provided to explain an exemplary embodiment in which the shielding component 111c for shielding the incident light which passes through the second pixel 111b is formed on a lower side of the second pixel 111b if the second pixel 111b is divided vertical-symmetrically. Referring to FIG. 6, other second pixels 111b may also have the shielding components on the respective lower sides thereof. However, this is merely an exemplary embodiment; the second pixel 111b may not be divided vertical-symmetrically and the shielding component 111c may be installed in other locations, such as on the upper side.

FIG. 7 is a view provided to explain an exemplary embodiment in which a second pixel 111b-1 is placed on the left side of a first pixel 111a-1 and includes the same shielding component pattern as the second pixel 111b of FIG. 5, and a second pixel 111b-3 is placed on the left side of a first pixel 111a-3 and includes the same shielding pattern as the second pixel 111b of FIG. 6 which is divided vertically with the shielding component on the lower part. Referring to FIG. 7, the pattern of the shielding component for shielding the incident side of the light from the second pixel may be implemented by combining the shielding pattern illustrated in FIGS. 5 and 6. It is understood that many different types of combinations are possible other than the combination shown in FIG. 7.

Figure 8:
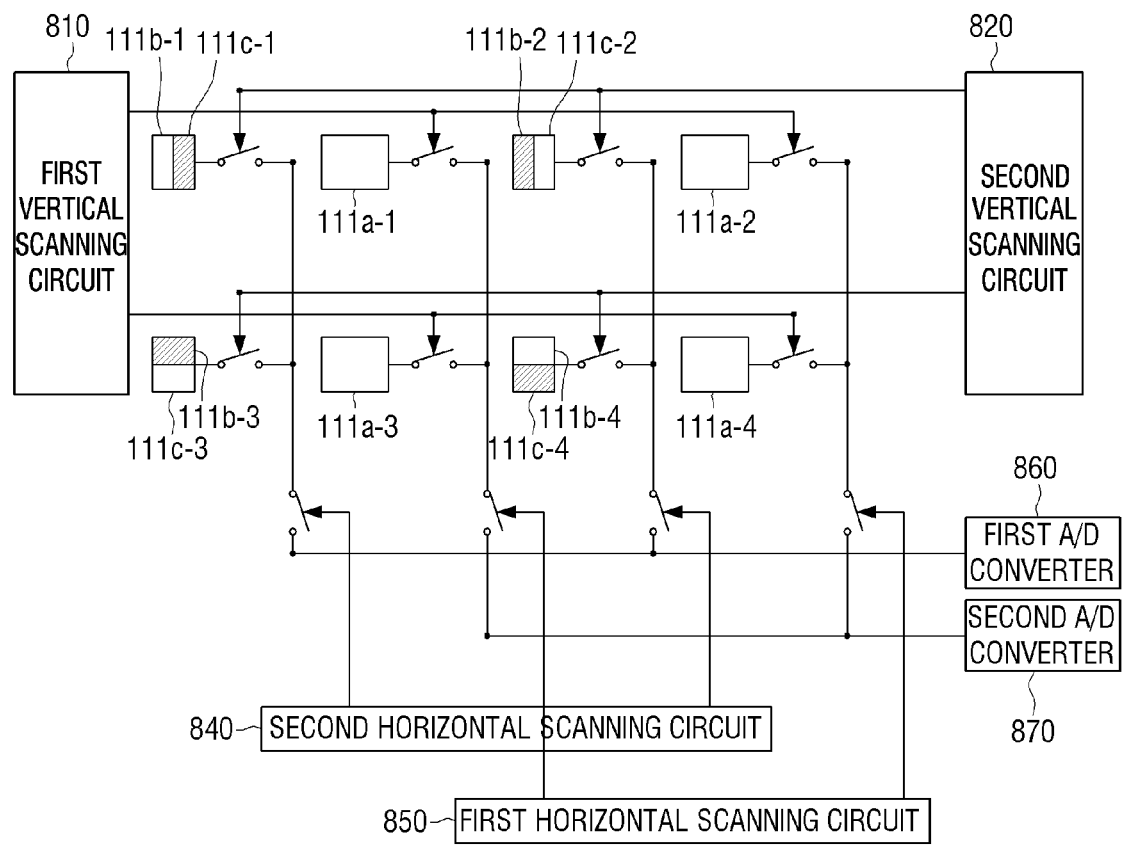
FIG. 8 is a view provided to explain the detailed constitution of the image pickup device according to an exemplary embodiment.

FIG. 8 is a view provided to explain the detailed constitution of the image pickup device according to an exemplary embodiment.

Referring to FIG. 8, the image pickup device 111 according to an exemplary embodiment may include the first pixel groups 111a-1 to 111a-4 and the second pixel groups 111b-1 to 111b-4. FIG. 8 illustrates the first and second pixel groups having a 2×2 cell array; however, this is merely an exemplary embodiment, and the first and second pixel groups may be configured in arrays other than 2×2 cell arrays.

The first pixel groups 111a-1 to 111a-4 and the second pixel groups 111b-1 to 111b-4 may be physically separated from each other to form independent states. The first pixel groups 111a-1 to 111a-4 and the second pixel groups 111b-1 to 111b-4 may connect to a first vertical scanning circuit 810 through a first vertical scanning line and to a second vertical scanning circuit 820 through a second vertical scanning line. Further, the first pixel groups 111a-1 to 111a-4 and the second pixel groups 111b-1 to 111b-4 may connect to a first horizontal scanning circuit 850 through a first horizontal scanning line and to a second horizontal scanning circuit 840 through a second horizontal scanning line.

The first pixel groups 111a-1 to 111a-4 may include four main pixels, and the second pixel groups 111b-1 to 111b-4 may include four sub pixels. The main pixels may read out the still image or the video image, and the sub pixels may read out the live view image including the phase differential information. However, as already described above with reference to FIG. 4, the sub pixels may be a pixel group that read out the live view image excluding the phase differential information.

The pixel values of the image read out by the main pixels may have a higher resolution than that of the pixel values of the image read out by the sub pixel. The number of the pixels in the first pixel groups 111a-1 to 111a-4 may be greater than or the same as the number (i.e., 4) of the pixels in the second pixel groups 111b-1 to 111b-4. For the sake of convenient explanation, the exemplary embodiment described herein assumes that the number of these two pixel groups are the same, although it is understood that other exemplary embodiments are not limited thereto.

Further, the pixels constituting the main pixels may have a greater size of a cell than that of the pixels constituting the sub pixels.

Further, the second pixel groups 111b-1 to 111b-4 may include the shielding component in each pixel. The second pixel groups 111b-1 to 111b-4 may read out the live view image while reading out the phase differential information.

According to another exemplary embodiment, the pixel values may be read out from the first pixel groups 111a-1 to 111a-4 and the second pixel groups 111b-1 to 111b-4, and the horizontal and vertical scanning lines to control reading may be formed independently. However, the vertical scanning line and the horizontal scanning line may include the first vertical scanning circuit 810 or the second vertical scanning circuit 820, and the first horizontal scanning circuit 850 or the second horizontal scanning circuit 840, respectively.

Specifically, if the first and second reset signals or the first and second controlling signals are received from the timing generator 112, the first pixel groups 111a-1, 111a-2, . . . , 111a-4 may be consecutively read out by the first reset signals. Simultaneously, the second pixel groups 111b-1, 111b-2, . . . , 111b-4 may be consecutively read out by the second reset signals.

The controller 130 may control reading the consecutively read-out pixel values by the first and second reset signals. Based on the first pixel values read from the first pixel groups, the still image or the video image may be photographed. Further, based on the second pixel values read from the second pixel groups, the live view image may be photographed. The capturing still image or the video image may have a higher resolution than that of the live view image. The pixel values read from the second pixel groups may include the phase differential information.

The image pickup apparatus 100 constituted with the image sensor according to an exemplary embodiment may separate and photograph the still image and the live view image from the object with the first pixel groups and the second pixel groups, respectively. The image pickup apparatus 100 may detect the phase differential information from the live view image, and thus acquire the phase differential AF information of the object in each frame of the live view image.

By utilizing the consecutively acquired phase differential AF information, the focal point of the object may be auto-adjusted during image pickup. The method of the phase differential AF according to an exemplary embodiment may detect the phase differential AF information from the consecutively-photographed live view image and adjust the focal point of the still image or the video image based on the phase differential AF information.

Thus, compared to the conventional method of generating the pixel values from the part of the pixel values of the still image, according to an exemplary embodiment, the phase differential AF method may simultaneously perform displaying the live view image and capturing the still image.

Further, the AF information may be acquired more precisely compared to the conventional methods, because the phase differential AF information of an object is acquired every frame while the live view image is displayed. Accordingly, the exemplary embodiment has the effect of performing high speed AF based on more precise focusing information.

Figure 9:
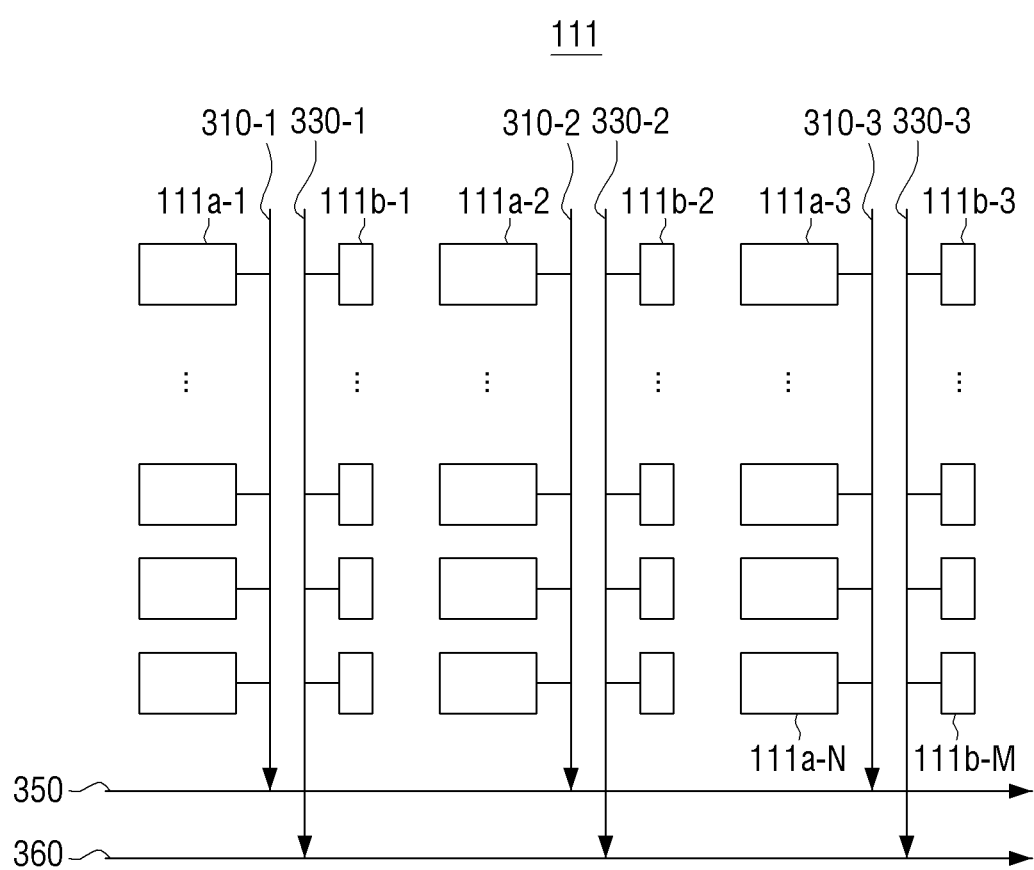
FIG. 9 is a view provided to explain the main pixel and the sub pixel constituting the imager according to another exemplary embodiment.

FIG. 9 is a view provided to explain the main pixels and the sub pixels constituting the imager according to another exemplary embodiment.

Referring to FIG. 9, the image pickup device 111 according to an exemplary embodiment may include first pixel groups 111a-1 to 111a-N and second pixel groups 111b-1 to 111b-M. The first pixel groups 111a-1 to 111a-N and the second pixel groups 111b-1 to 111b-M may be physically separated from each other to form independent states.

The first pixel groups 111a-1 to 111a-N and the second pixel groups 111b-1 to 111b-M may connect to a vertical scanning circuit (not illustrated) and a horizontal scanning circuit (not illustrated) through the first vertical scanning lines 310-1 to 310-3 or the second vertical scanning lines 330-1 to 330-3, and the first horizontal scanning line 350 or the second horizontal scanning line 360, respectively.

The first pixel groups 111a-1 to 111a-N may include N of the main pixels and the second pixel groups 111b-1 to 111b-M may include M of the sub pixels. The main pixels may read the still image or the video image, and the sub pixels may read the live view image including the contrast AF information.

The pixel values read out by the main pixels may have a higher resolution than that of the pixel values of the image read out by the sub pixels. The number N of the first pixel groups 111a-1 to 111a-N may be the same as or greater than the number M of the second pixel groups 111b-1 to 111b-M. The second pixel groups 111b-1 to 111b-M may be placed regularly or randomly between the first pixel groups 111a-1 to 111a-N.

Further, the pixels constituting the main pixels may have a greater size of a cell than that constituting the sub pixels.

According to another exemplary embodiment, the horizontal scanning line and the vertical scanning line to read out the pixel values from the first pixel groups 111a-1 to 111a-N and the second pixel groups 111b-1 to 111b-M, and control the same, may be constructed independently. However, the vertical scanning line and the horizontal scanning line may include a separate vertical scanning circuit or horizontal scanning circuit, respectively.

Specifically, if the first reset signals are received from the timing generator 112, the first pixel groups 111a-1, 111a-2, . . . , 111a-N may be consecutively read out by the first reset signals. Simultaneously, the second pixel groups 111b-1, 111b-2, . . . , 111b-M may be consecutively read out by the second reset signals.

The controller 130 may control so that the pixel values consecutively read out by the first and second reset signals are read. Based on the first pixel value read out from the first pixel group, the still image or the video image may be photographed. Further, based on the second pixel value read out from the second pixel group, the live view image may be picked up. The captured still image or video image has a higher resolution than that of the live view image.

The image pickup apparatus 100 constituted with the image sensor may separate and capture the still image and the video image from the object with the first pixel group and the second pixel group. The image pickup apparatus 100 may detect the contrast AF information from the live view image. Thus, the contrast AF information of the object in each frame of the live view image may be captured.

By utilizing the consecutively acquired contrast AF information, the focal point of the object may be auto-adjusted during image pickup. The method of performing contrast AF according to an exemplary embodiment may detect the contrast AF information from the consecutively-captured live view image, and adjust the focal point of the still image or the video image based on the detected contrast AF information.

Thus, compared to the conventional method of generating the pixel values from the part of the pixel values of the still image, the method of performing the contrast AF according to an exemplary embodiment may simultaneously perform displaying the live view image and performing image pickup of the still image. Thus, the exemplary embodiment has the effect of simultaneously capturing and storing the still image while displaying the live view image.

Further, because the contrast AF information of the object in each frame is acquired while displaying the live view image, the image pickup operation does not stop to capture the AF information, in contrast to the conventional methods. Accordingly, the exemplary embodiment achieves a high speed AF capability.

Figure 10:
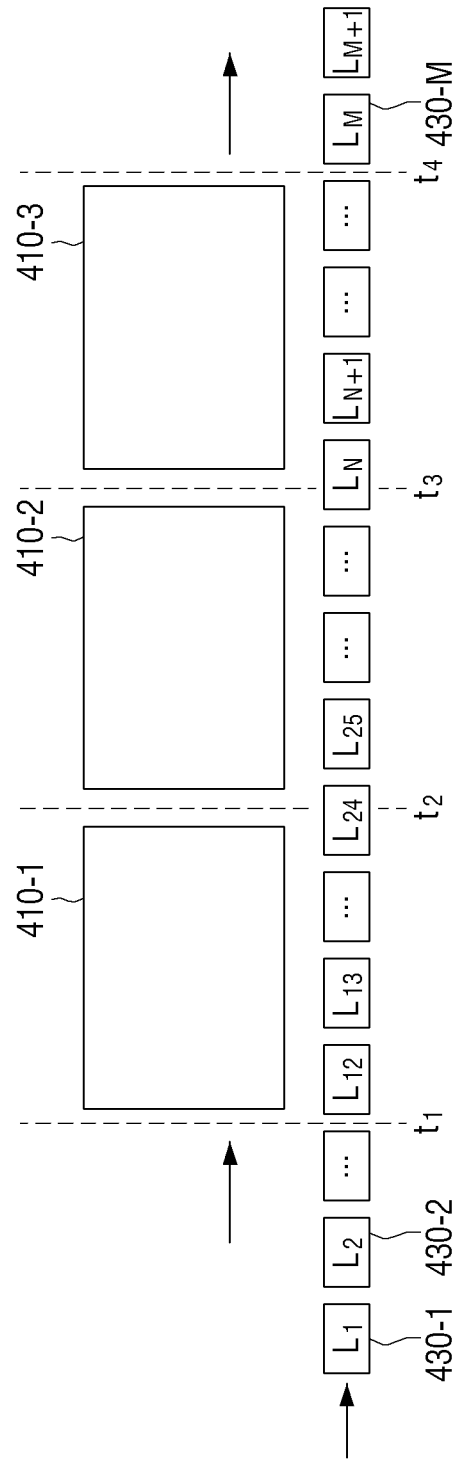
FIG. 10 is a conceptual view provided to explain the displaying the still image and the live view image consecutively according to an exemplary embodiment.

FIG. 10 is a conceptual view provided to explain simultaneous displaying of the still image and the live view image according to another exemplary embodiment.

Referring to FIG. 10, the live view images 430-1 to 430-M may be consecutively displayed, and acquired at times t1, t2, t3 of capturing the still images 410-1, 410-2, 410-3.

The still images 410-1, 410-2, 410-3 illustrated in FIG. 10 may be acquired by the first pixel group of the imager 110 and the live view images 430-1 to 430-M may be acquired by the second pixel group.

The above will be explained in greater detail below. If the image pickup apparatus 100 begins capturing images of the object, the captured object image may be displayed on the display 160 in the live view image. The live view image may be a real-time image of the captured object image such as a person or a landscape to be captured by the image pickup apparatus 100. The live view image may be a consecutively-captured image of the object having a lower pixel value for the determined frame rate, however, may not be stored in the storage 150.

The contrast AF processor 170 may detect the contrast AF information from some pixels of the frame constituting the live view image. The contrast AF method may compare the contrast values of the image pixels and adjust the focal point on the lens position having the highest contrast value.

The contrast AF processor 170 may detect the contrast values from the pixel values of each frame constituting the live view image, compare the contrast values, and adjust the focal point on the position having the highest contrast value. If the object moves and the focal point changes, the contrast AF processor 170 may detect the contrast values from the live view image of the changed object, compare the contrast values, and newly adjust the focal point.

During display of the live view image, if the user inputs an image pickup command of the still image to the image pickup apparatus 100 at time t1, the focal point of the lens may be adjusted based on the contrast AF information detected from the live view image L12 at t1, the object may be photographed, and the still image 410-1 may be captured. The captured still image 410-1 may be compressed by the compressor and stored in the storage 150.

During image pickup, compressing, and storing of the captured still image 410-1, the live view images L13 to L24 may be displayed. The live view images L13 to L24 may be captured based on the pixel values read out from the second pixel group of the imager 110, and the still image 410-1 may be captured based on the pixel values from the first pixel group of the imager 110. Thus, the live view image may be displayed on the display 160 during image pickup.

Likewise, if the user inputs commands to perform image pickup of the still image at t2, t3, the second still image 410-2 and the third still image 410-3 at t2, t3, respectively may be captured, compressed, and stored on the storage 150. The contrast AF information of the second still image 410-2 may be acquired based on the contrast AF information generated from the live view image L24. Further, the contrast AF information of the third still image 410-3 may be acquired based on the contrast AF information generated from the live view image $L_N$.

Figure 11:
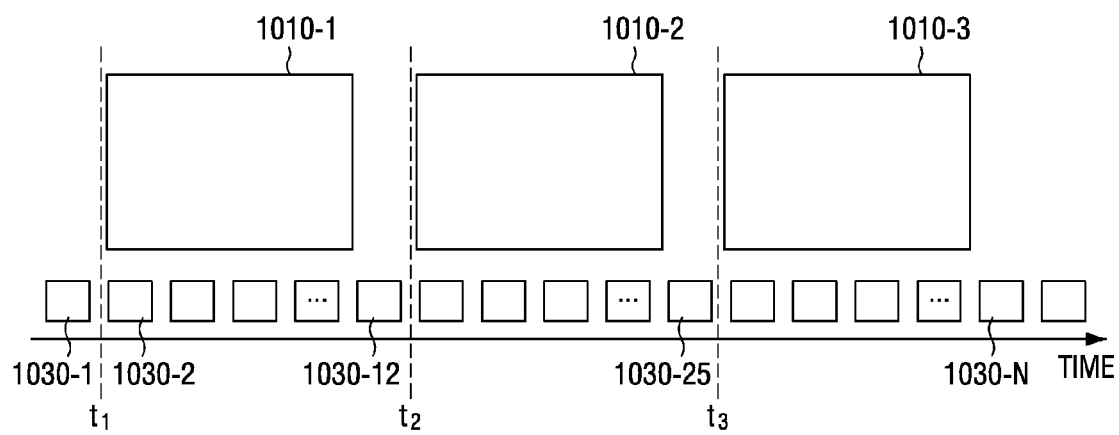
FIG. 11 is a conceptual view provided to explain the displaying the still image and the live view image consecutively according to another exemplary embodiment.

FIG. 11 is a conceptual view provided to explain simultaneous displaying of the still image and the live view image according to an exemplary embodiment.

Referring to FIG. 11, the live view images 1030-1 to 1030-N may be consecutively displayed, and the still images 1010-1, 1010-2, and 1010-3 may be acquired at times, t1, t2, t3 of performing image pickup.

The still images 1010-1, 1010-2, and 1010-3 illustrated in FIG. 11 may be acquired by the first pixel group of the imager 110, and the live view images 1030-1 to 1030-N may be acquired by the second pixel group.

The above will be explained in greater detail below. If the image pickup apparatus 100 begins capturing images of the object, the captured object image may be displayed on the display 160 in the live view image. The live view image may be a real-time image of the captured object image such as a person or a landscape acquired by the image pickup apparatus 100. The live view image may be a consecutively-captured image of the object having a lower pixel value for the determined frame rate, however, may not be stored in the storage 150.

The AF processor 170 may analyze the phase difference of the pixel values read out by the second pixel group and detect the phase differential AF information. The phase differential AF method may compare the phase difference of a plurality of pixel values and adjust the focal point of the lens.

The AF processor 170 may detect the phase differential values from the pixel values of each frame constituting the live view image, and adjust the focal point based on the phase differential values. If the object moves and the focal point changes, the AF processor 170 may detect the phase differential values from the live view image of the changed object and newly adjust the focal point by utilizing the detected phase differential values.

If the user inputs the image pickup command to the image pickup apparatus 100 at t1 while the live view image is displayed, the focal point of the lens may be adjusted based on the phase differential information detected from the live view image 1030-1 at t1, and images of the object are captured so that the still image 1010-1 is acquired. The captured still image 1010-1 may be stored on the storage 150.

During image pickup and storing of the captured still image 1010-1, the live view images 1030-2 to 1030-11 may be consecutively displayed. The live view images 1030-2 to 1030-11 may be captured from the pixel values read out from the second pixel group of the imager 110, and the still image 1010-1 may be captured based on the pixel values read from the first pixel group of the imager 110. Because the first pixel group and the second pixel group may be controlled independently and output signals, the live view images acquired by the second pixel group may be displayed on the display 160, while the images acquired by the first pixel group are stored at the same time.

Likewise, if the user commands image pickup at t2, t3, the controller 130 may control so that the second still image 1010-2 and the third still image 1010-3 are captured at respective time points and stored on the storage 150.

The phase differential AF information of the second still image 1010-2 may be acquired based on the phase differential AF information captured from the live view image 1030-12. Further, the phase differential AF information of the third still image 1010-3 may be acquired based on the phase differential AF information captured from the live view image 1030-25.

Figure 12:
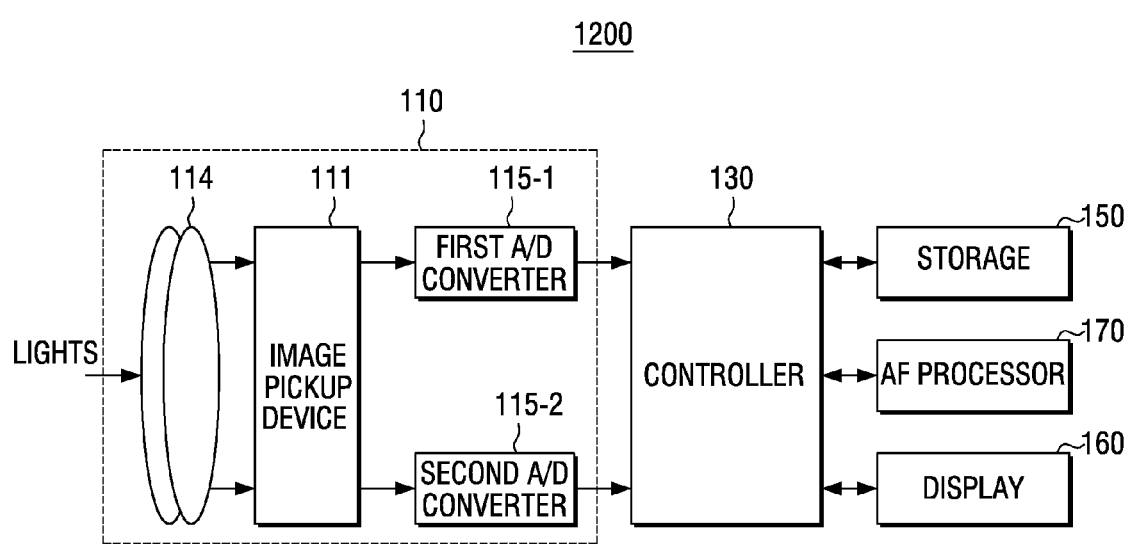
FIG. 12 is a block diagram of an image pickup apparatus according to another exemplary embodiment.

FIG. 12 is a block view provided to explain an image pickup apparatus according to another exemplary embodiment.

Referring to FIG. 12, the image pickup apparatus 1200 may include an imager 110, a controller 130, a storage 150, a display 160 and an AF processor 170.

The imager 110 may capture the image of an object by utilizing a plurality of pixels divided into a plurality of first pixel groups and a plurality of second pixel groups. The controller 130 may process the image acquired by the imager 110. The display 160 may display the photographed image processed by the controller 130. The AF processor 170 may detect the phase differential information from the pixel values read from the second pixel group. The controller 130 may consecutively scan the first reset signals and the second reset signals for simultaneously beginning the exposure of the pixels in a plurality of first pixel groups and a plurality of second pixel groups, and control so that the pixel values of a plurality of first pixel groups and a plurality of second pixel groups are consecutively read out according to the scanning command.

The imager 110 may include a lens 114 for receiving light, an image pickup device 111 for converting the received light into electrical signals, and A/D converters 115-1, 115-2.

The image pickup device 111 may convert the light signals passed through the lens 114 into electrical signals. The image pickup device 111 may capture the still image and the live view image from a plurality of pixels divided into a plurality of first and second pixel groups, respectively.

A plurality of first pixel groups may include a plurality of pixels in matrix form, and a plurality of second pixel groups may include a plurality of pixels having the same form as the first pixel groups. Alternatively, a plurality of second pixel groups may be constituted in a space between a plurality of pixels of a plurality of first pixel groups, or in another configuration altogether.

A plurality of first and second pixel groups may operate independently, a plurality of first pixel groups may perform the functions of an image sensor, and a plurality of second pixel groups may perform an operation of capturing the image including the phase differential information.

Depending on designs, a first controller (not illustrated) and a first output unit (not illustrated) may be separately added for efficient algorithm processing of the pixels of a plurality of first pixel groups, and a second controller (not illustrated) and a second output unit (not illustrated) may be separately provided to acquire image information of the pixels of a plurality of second pixel groups. The first and second output units may be physically separated. Otherwise, the first and second output units may be physically shared but used at different times. In other words, the first and second output units may be designed to be shared as one output unit.

The image signals acquired by a plurality of first pixel groups may be converted to the first digital signals through the first A/D converter 115-1, and the image signals acquired by a plurality of second pixel groups may be converted to the second digital signals through the second A/D converter 115-2.

The converted first and second digital signals may be stored on the storage 150, or displayed on the display 160 in the live view image, or inputted to the phase differential AF processor 170 to be utilized as the auto focusing (AF) information of the object, according to the controlling signals of the controller 130.

The AF processor 170 may detect the information regarding the focal point by performing the phase differential AF according to the phase differential information included in the pixel values generated from the second pixel group among the pixel values captured by the image pickup device 111, and adjust the focal point of the object according to the detected focal point.

The controller 130 may control the imager 110 to adjust the focal point of the lens 114 based on the phase differential information detected by the AF processor 170.

Further, the controller 130 may display the captured live view image on the display 160 based on the information of the live view image.

In the image pickup apparatus 100 according to an exemplary embodiment, the image pickup device 111 (e.g., first and second pixel groups) may be employed independently from each other.

A plurality of first pixel groups may operate as the image pickup devices to capture the still image or the video image of the object. A plurality of second pixel groups may operate as the image pickup devices to capture the image to detect the AF information for adjusting the focal point of the object.

A plurality of second pixel groups according to an exemplary embodiment may capture the image to detect the AF information, and thus, may be designed to capture the image having a lower resolution. A plurality of second pixel groups may have a smaller number and size of pixels compared to those of a plurality of first pixel groups.

Further, unlike a plurality of first pixel groups, a plurality of second pixel groups may not be in the matrix form, and may be implemented as two or more pixels formed in a space between the pixels constituting a plurality of first pixel groups, or in another configuration.

The controller 130 may control the display 160 to continue a live view operation while the read pixel values are stored on the storage 150. The still image or the video image may be read out by the first pixel groups and the image to be displayed in the live view image may be read out by the second pixel groups. The high speed AF image pickup apparatus 1200 according to another exemplary embodiment has the effect of storing the still image simultaneously while displaying the live view image.

Figure 13:
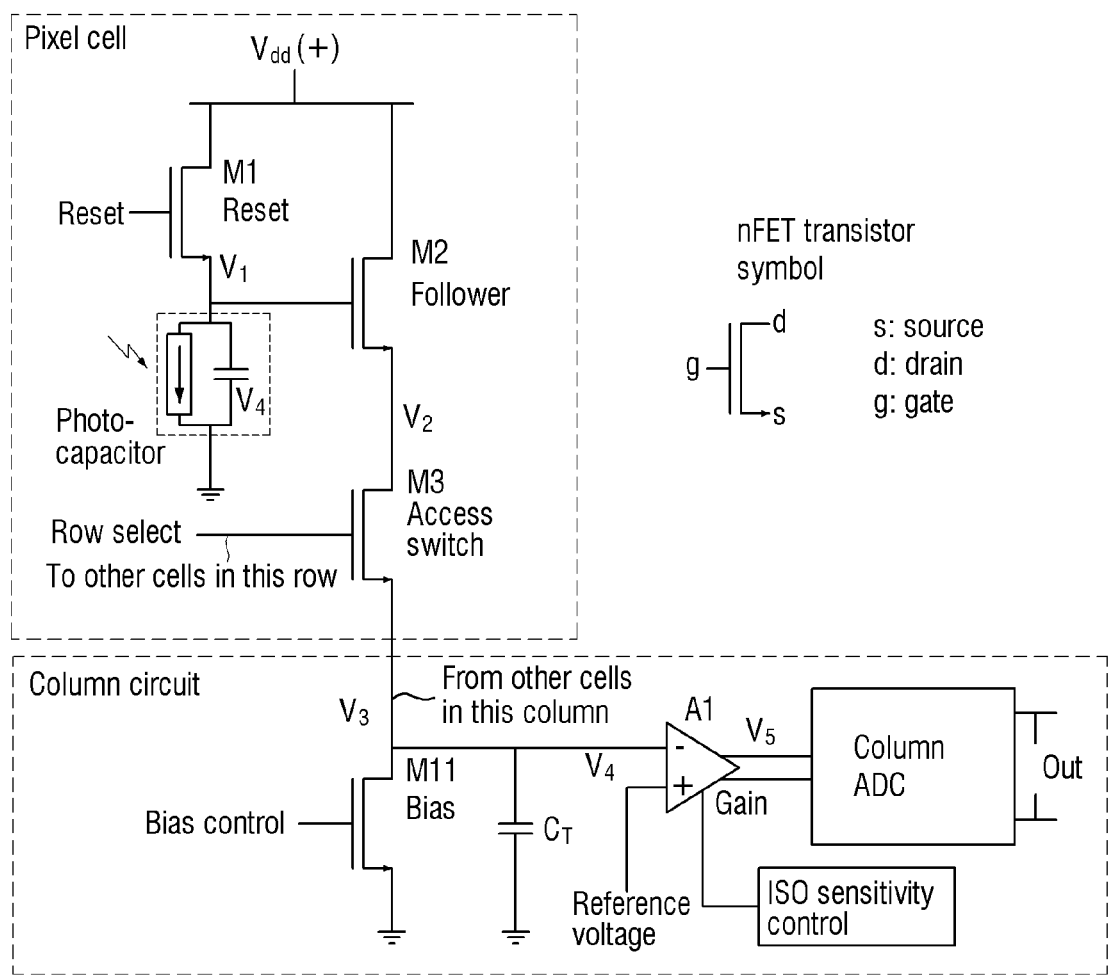
FIG. 13 is a view provided to explain the circuits of the imager of FIG. 2.

FIG. 13 is a view provided to explain the circuits of the image pickup device of FIG. 1.

Referring to FIG. 13, the CCD pixel cell and the AD converter are illustrated.

The CCD pixel cell may be one of the image pickup devices as illustrated in FIG. 4. Specifically, in the CCD pixel cell, the metal-oxide-silicon (MOS) and the capacitor may be placed near each other and the charge carrier of the MOS may be stored on the capacitor by light exposure. Thus, according to the exposing time, the size of the charge carrier stored on the capacitor may change.

The AD converter may read the size of the charge carrier stored on the capacitor, in other words, read the voltage value of the capacitor and output the voltage value as the digital signals. The AD converter may connect to the columns within the matrix, respectively.

Figure 14:
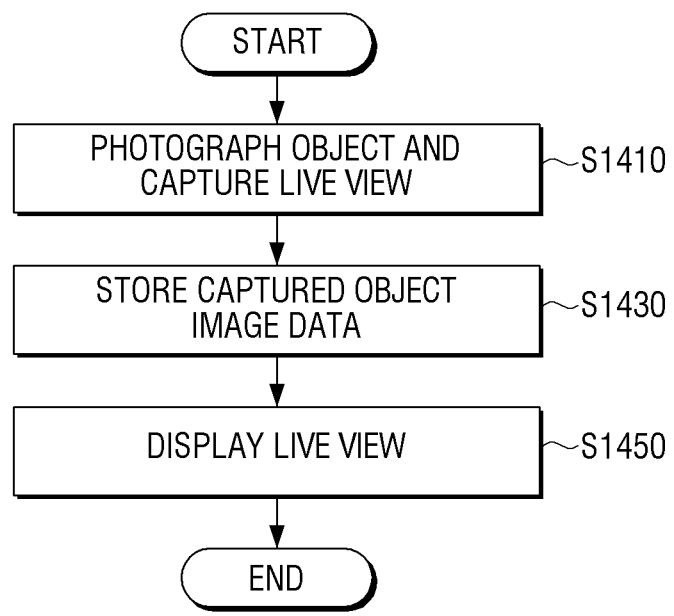
FIG. 14 is a flowchart provided to explain an image pickup method of an image pickup apparatus according to another exemplary embodiment.

FIG. 14 is a flowchart provided to explain an image pickup method of the high speed AF image pickup apparatus according to another exemplary embodiment.

By referring to FIG. 14, the image pickup apparatus 100 according to another exemplary embodiment may pickup the image and capture the live view at operation S1410, store the captured image data at operation S1430, and display the live view by utilizing the captured live view image at operation S1450.

To pickup the image of the object and capture the live view, the object may be acquired by utilizing the first pixel groups installed on the imager (e.g., imager 110) and the live view of the object may be captured by utilizing the second pixel groups installed on the imager (e.g., imager 110) at operation S1310.

At operation S1430, the image data taken by the first pixel groups may be stored.

At operation S1350, the live view captured by the second pixel groups may be displayed.

The image pickup method of the image pickup apparatus according to another exemplary embodiment may consecutively scan the reset signals. A plurality of first and second pixel groups may read out the pixels. The phase differential AF information may be detected from the pixel values read from a plurality of second pixel groups, and the focal point of the object may be adjusted by utilizing the phase AF information and the information related to displaying the live view. While storing the captured image, the live view image may be displayed.

To consecutively scan the reset signals, the reset signals for beginning the exposure of the pixels, e.g., the first and second reset signals, are scanned in sequence in the image pickup device 111 including a plurality of pixels divided into a plurality of first and second pixel groups. Specifically, the first reset signals and the second reset signals are scanned independently from each other, because the first pixel groups and the second pixel groups are connected to separate vertical and horizontal scanning lines, respectively, and controlled by the circuits connected to the vertical and horizontal scanning lines.

The pixel values of a plurality of first and second pixel groups may be consecutively read out in each pixel group. Specifically, after scanning the first reset signals to the first pixel groups, the pixel value of each pixel within the first pixel groups may be read in a predetermined time. Likewise, after scanning the second reset signals to the second pixel groups, the pixel value of each pixel within the second pixel groups may be read in a predetermined time.

Based on the pixel values read from the pixels of the second pixel groups, the phase differential AF information and the live view displaying information may be detected. Specifically, because the pixel values of the pixels in the second pixel groups may have a phase difference from each other, the phase differential information may be detected by comparing the pixel values of the pixels.

The read pixel values to store on the storage (e.g., storage 150) or to display on the display (e.g., display 160) may be compressed on a pixel group basis. Specifically, a plurality of pixel values read based on the pixel group may be compressed by utilizing, for example, near-lossless algorithms. It is understood that algorithms other than a near-lossless algorithm may be employed according to other exemplary embodiments.

The pixel values compressed on the first pixel group basis may be stored, and the pixel values compressed on the second pixel group basis may be displayed in the live view image. The compressed pixel values may be restored, and a plurality of restored pixel values may be combined to generate an image. The image pickup method of the high speed AF image pickup apparatus according to an exemplary embodiment may detect the phase differential information from the image acquired by the second pixel groups. Thus, the focal point of the object may be adjusted in each frame of the captured live view image. Simultaneously, the image acquired by the first pixel groups may be the still image or the video image that can be stored on the storage (e.g., storage 150).

The function of displaying the live view image and the function of storing the still image may be performed simultaneously. By detecting the phase differential information from the live view image, the auto focusing may be performed at a high speed.

Further, the image pickup method as described above may be implemented as at least one computer program to implement the image pickup method of the image pickup apparatus, and the computer program may be stored on a computer readable recording medium.

Thus, the operations including capturing of an image of an object by utilizing a first pixel group installed on an imager, capturing a live view of the object by utilizing a second pixel group installed on an imager, storing of the image data acquired by the first pixel group, and displaying of the live view captured by the second pixel group, may be implemented with the code of the computer readable recording medium, which can be recorded on the computer. The computer readable recording medium may be the device storing the data to be read out by the computer system.

The foregoing exemplary embodiments and advantages are merely exemplary and are not to be construed as limiting the present disclosure. The present teachings can be readily applied to other types of apparatuses. Also, the description of the exemplary embodiments of the present disclosure is intended to be illustrative, and not to limit the scope of the claims, and many alternatives, modifications, and variations will be apparent to those skilled in the art.

What is claimed is:

1. An image pickup apparatus, comprising:
an image sensor comprising a first pixel group and a second pixel group;
a controller which controls the image sensor to capture an image of an object by using the first pixel group and to capture a live view of the object by using the second pixel group;
a storage which stores the image captured by the first pixel group; and
an auto focusing (AF) processor which generates AF information by using the live view captured by the second pixel group,
wherein the second pixel group comprises a plurality of pixels and a shielding component to generate a phase difference of incident light received at each of the plurality of pixels, and the AF processor generates the AF information by performing phase differential AF of the live view captured by the second pixel group based on the phase difference.

2. The image pickup apparatus of claim 1, further comprising:
a user interface which receives a consecutive image capture command and transmits the consecutive image capture command to the controller,
wherein the controller receiving the consecutive image capture command controls the image sensor to perform consecutive image captures by using the first pixel group at a predetermined time interval, and to continuously capture the live view by using the second pixel group during the consecutive image captures.

3. The image pickup apparatus of claim 2, wherein the controller controls the image sensor to adjust a focus of the image sensor based on a live view captured at a time of beginning each image capture by using the AF information generated by the AF processor.

4. The image pickup apparatus of claim 1, wherein the first pixel group comprises a plurality of first pixels arranged in a matrix form having a plurality of lines and a plurality of columns, and the second pixel group comprises a plurality of second pixels arranged to be matched with the first pixels, respectively.

5. The image pickup apparatus of claim 4, wherein some of the plurality of second pixels comprise a shielding component to partly shield incident light.

6. The image pickup apparatus of claim 4, wherein a size of each of the first pixels is greater than a size of each of the second pixels, and a number of the first pixels is greater than a number of the second pixels.

7. The image pickup apparatus of claim 1, further comprising a display which continuously displays the live view.

8. The image pickup apparatus of claim 1, wherein the image of the object comprises a moving image, and
the storage stores the moving image captured by the first pixel group.

9. An image pickup method which is performed by an image pickup apparatus including an image sensor, the image pickup method comprising:
capturing image data of an object by using a first pixel group of the image sensor, and capturing a live view of the object by using a second pixel group of the image sensor, wherein the second pixel group comprises a plurality of pixels and a shielding component to generate a phase difference of incident light received at each of the plurality of pixels;
storing the image data captured by the first pixel group;
displaying the live view captured by the second pixel group; and
generating auto-focusing (AF) information by performing phase differential AF on the live view captured by the second pixel group based on the phase difference.

10. The image pickup method of claim 9, wherein, during consecutive image captures, the image pickup method further comprises:
generating the AF information by performing the phase differential AF of a live view captured at a time of beginning each image capture; and
adjusting a focus by using the AF information generated at the time of beginning each image capture.

11. The image pickup method of claim 9, wherein the first pixel group comprises a plurality of first pixels arranged in matrix form having a plurality of lines and a plurality of columns, and the second pixel group comprises a plurality of second pixels arranged to be matched with the first pixels, respectively.

12. The image pickup method of claim 10, wherein a size of each of the first pixels is greater than a size of each of the second pixels, and a number of the first pixels is greater than a number of the second pixels.

13. The image pickup method of claim 9, wherein the image data of the object comprises a moving image data, and
the storing stores the moving image data captured by the first pixel group of the image sensor.

14. A non-transitory computer-readable recording medium comprising a program stored thereon which causes a computer to implement an image pickup method, the image pickup method comprising:
capturing image data of an object by using a first pixel group of an image sensor, and capturing a live view of the object by using a second pixel group of the image sensor, wherein the second pixel group comprises a plurality of pixels and a shielding component to generate a phase difference of incident light received at each of the plurality of pixels;
storing the image data captured by the first pixel group;
displaying the live view captured by the second pixel group; and
generating auto-focusing (AF) information by performing phase differential AF on the live view captured by the second pixel group based on the phase difference.

15. The non-transitory computer-readable recording medium of claim 14, wherein the image data of the object comprises a moving image data, and
the storing stores the moving image data captured by the first pixel group.

* * * * *